(12) United States Patent
Cao

(10) Patent No.: US 8,373,076 B2
(45) Date of Patent: Feb. 12, 2013

(54) SHIELDING ASSEMBLY

(75) Inventor: Guang-Fei Cao, Shenzhen (CN)

(73) Assignees: Shenzhen Futaihong Precision Industry Co., Ltd., Shenzhen (CN); FIH (Hong Kong) Limited, Kowloon (HK)

(*) Notice: Subject to any disclaimer, the term of this patent is extended or adjusted under 35 U.S.C. 154(b) by 241 days.

(21) Appl. No.: 12/889,620

(22) Filed: Sep. 24, 2010

(65) Prior Publication Data

US 2012/0012381 A1 Jan. 19, 2012

(30) Foreign Application Priority Data

Jul. 16, 2010 (CN) .......................... 2010 1 0229053

(51) Int. Cl.
*H05K 9/00* (2006.01)

(52) U.S. Cl. .................... 174/382; 174/385; 174/384

(58) Field of Classification Search .................. 174/377, 174/382, 384, 385; 361/816
See application file for complete search history.

(56) References Cited

U.S. PATENT DOCUMENTS

| | | | | |
|---|---|---|---|---|
| 5,175,395 A | * | 12/1992 | Moore | 174/372 |
| 5,614,694 A | * | 3/1997 | Gorenz et al. | 174/375 |
| 5,796,578 A | * | 8/1998 | Jones | 361/679.55 |
| 6,313,400 B1 | * | 11/2001 | Mosquera et al. | 174/363 |
| 6,469,904 B1 | * | 10/2002 | Vigeant et al. | 361/752 |
| 6,831,224 B2 | * | 12/2004 | Koivusilta | 174/375 |
| 6,897,371 B1 | * | 5/2005 | Kurz et al. | 174/382 |
| 7,071,409 B2 | * | 7/2006 | Richard et al. | 174/377 |
| 7,358,447 B2 | * | 4/2008 | Gabower | 174/378 |
| 7,924,571 B2 | * | 4/2011 | Tsubono | 361/752 |
| 2009/0262511 A1 | * | 10/2009 | Long | 361/816 |
| 2010/0053926 A1 | * | 3/2010 | Shi et al. | 361/816 |
| 2011/0214916 A1 | * | 9/2011 | Chang | 174/382 |
| 2012/0257369 A1 | * | 10/2012 | Zhao et al. | 361/818 |
| 2012/0298414 A1 | * | 11/2012 | Park | 174/382 |

* cited by examiner

*Primary Examiner* — Hung Ngo
(74) *Attorney, Agent, or Firm* — Altis Law Group, Inc.

(57) ABSTRACT

A shielding assembly includes a frame including a catch protruding near one end thereof; and a cover including a main body. The main body is punched to form an opening and a latching portion protruding from the main body and aligned with the opening; the latching portion latches with the catch, the latching portion shields the opening to improve the shielding affect of the shielding assembly.

16 Claims, 4 Drawing Sheets

SHIELDING ASSEMBLY

BACKGROUND

1. Technical Field

This disclosure relates to shielding assemblies, particularly to a shielding assembly for portable electronic devices.

2. Description of Related Art

A typical portable electronic device, such as a mobile phone, generally includes a printed circuit board with one or more electrical components and a shielding assembly mounted to the printed circuit board for shielding the electrical components. The shielding assembly generally includes a frame with a plurality of holes and a cover punched to form a number of bent portions with a number of protrusions formed on the bent portions. Each protrusion latches in one of the holes to latch the frame to the cover. However, a number of openings will be defined through the cover adjacent when the bent portions are formed reducing the effectiveness of the shielding assembly.

Therefore, there is a room for improved in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary shielding assembly. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
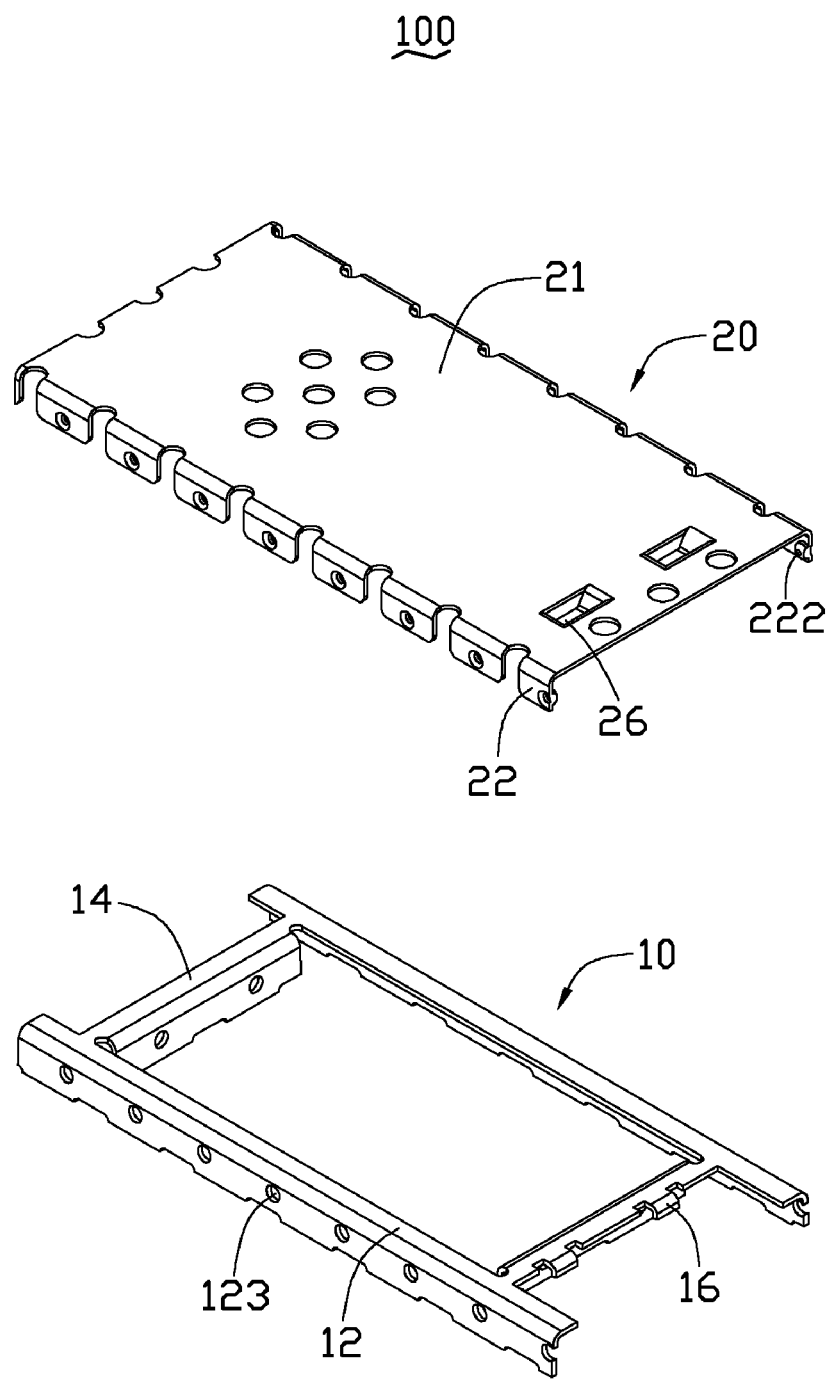
FIG. 1 is an exploded view of an exemplary embodiment of a shielding assembly.
Figure 2:
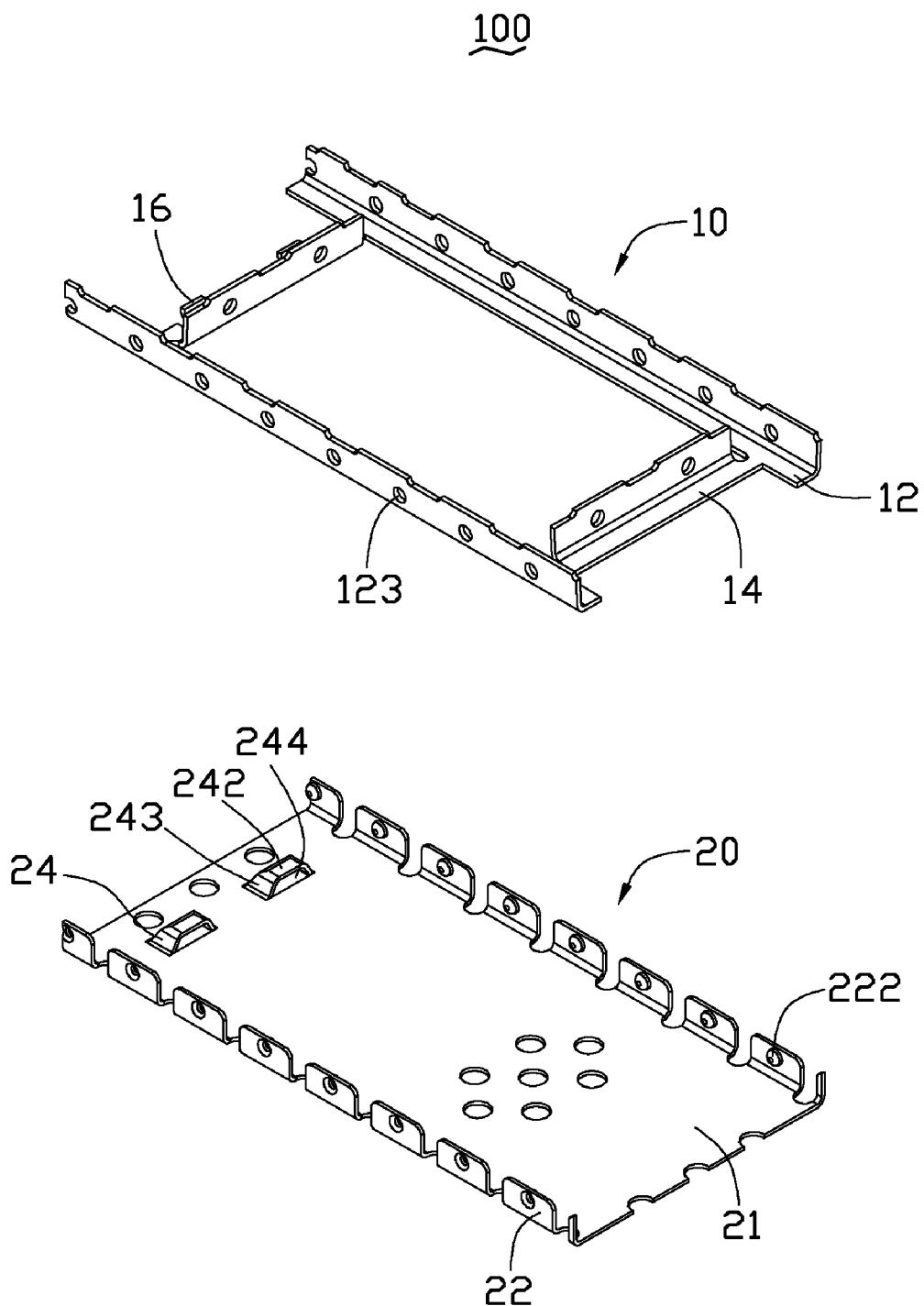
FIG. 2 is another exploded view of the shielding assembly shown in FIG. 1.
Figure 3:
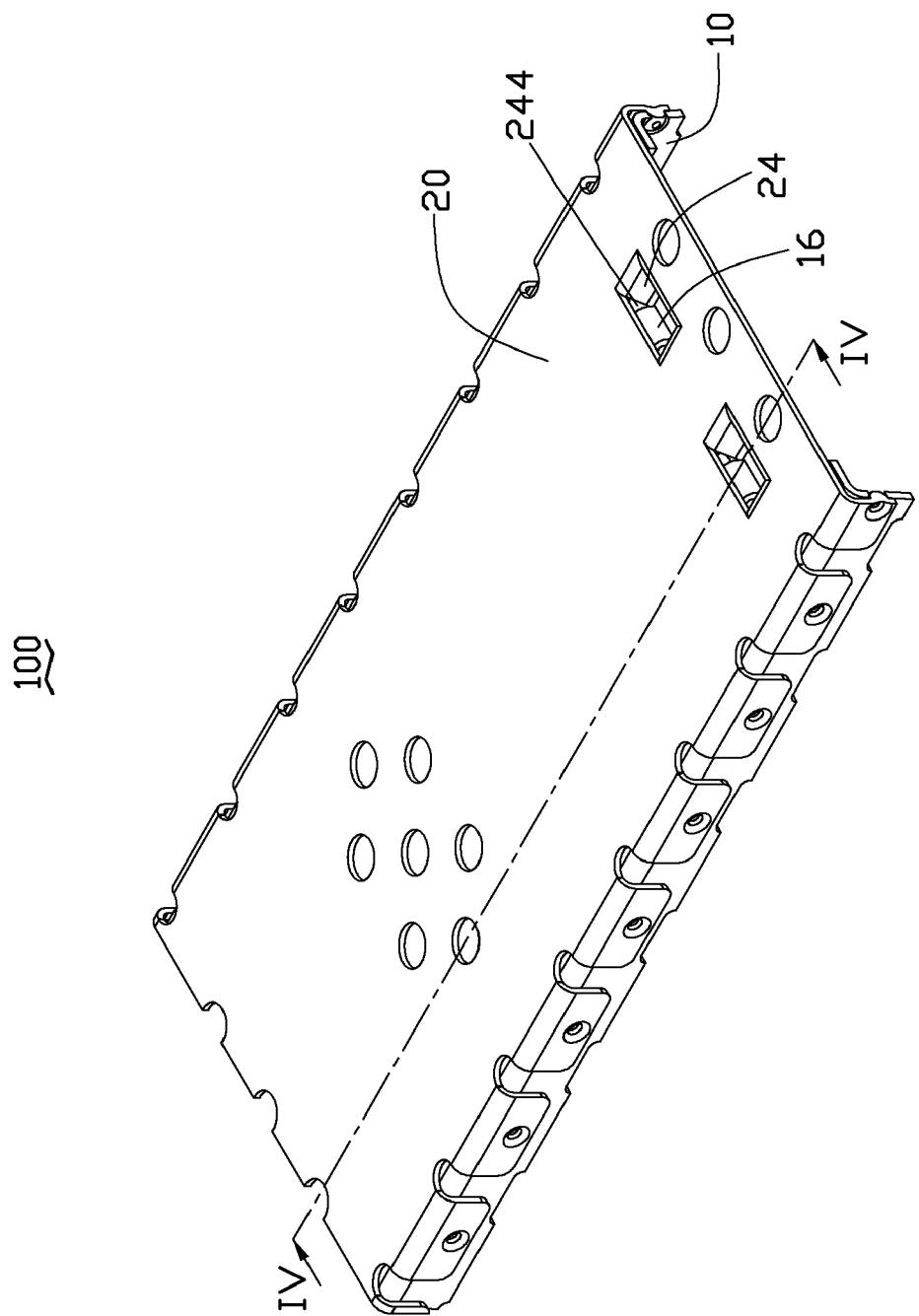
FIG. 3 is an assembled view of the shielding assembly in FIG. 1.
Figure 4:
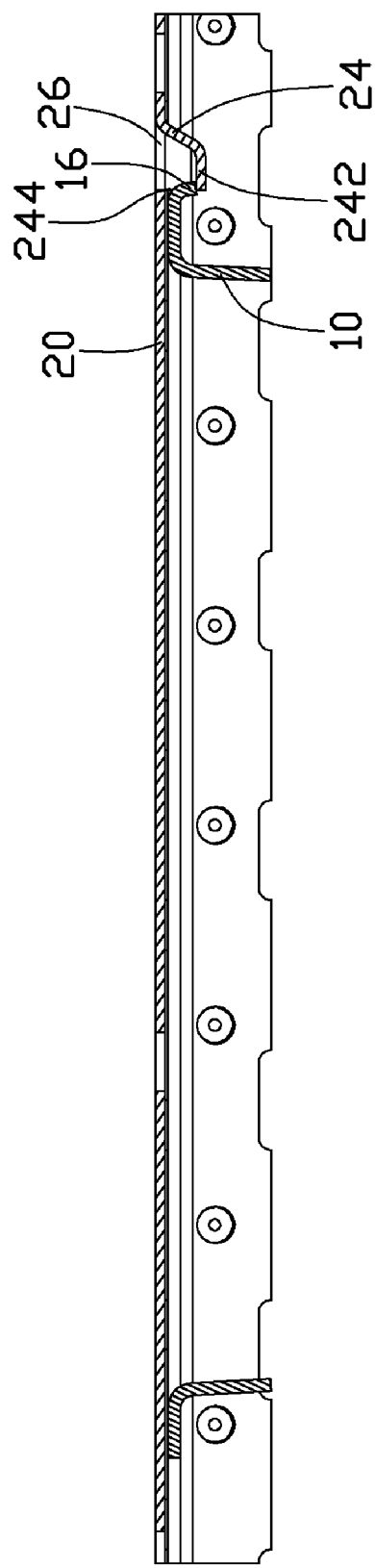
FIG. 4 is a cross-sectional view of the shielding assembly shown in FIG. 3 along the line IV-IV.

Referring to FIGS. 1-4, a shielding assembly 100 includes a frame 10 and a cover 20 latched to the frame 10. The frame 10 may be mounted to a circuit board of an electronic device (not shown), for accommodating electrical components of the electronic device. The frame 10 may be formed by punching a metallic plate and includes two opposite sidewalls 12, two opposite end walls 14 and at least one catch 16, such as two catches 16. The end walls 14 respectively connect with the sidewalls 12. Each sidewall 12 further defines a plurality of holes 123. The catches 16 are both protruding from one of the end walls 14, and are substantially L-shaped (FIG. 4).

The cover 20 includes a main body 21, a plurality of bent portions 22 protruding from two sides of the main body 21, and at least one latching portion 24, such as two latching portions 24 positioned near one end of the main body 21 corresponding to the catches 16. Each bent portion 22 has a protrusion 222 protruding from an inner surface thereof corresponding to the holes 123. Each latching portion 24 is a hollow trapezoid in shape and includes a resisting plate 242 spaced from the main body 21, two connecting plate 243 respectively protruding from opposite ends of the resisting plate 242 for connecting the resisting plate 242 to the main body 21, and a latching groove 244 defined between the resisting plate 242 and the main body 21. Each catch 16 latches in one of the latching grooves 244 and resists a corresponding one of the resisting plates 242 to assist the cover 20 to latch on the frame 10. In this exemplary embodiment, each latching portion 24 may be made by punching the main body 21, so that two openings 26 (FIG. 4) are defined in the main body 21 and aligned with the resisting plates 242. In this exemplary embodiment, the resisting plates 242 are aligned with and shield the openings 26 to improve the shielding effect of the shielding assembly 100. Additionally, the catches 16 latch in the latching grooves 244 to further shield the openings 26 so the shielding affect of the shielding assembly 100 can be further improved.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. A shielding assembly, comprising:
   a frame defining a plurality of holes at two sides thereof and including a catch protruding near one end thereof; and
   a cover including a main body, a plurality of protrusions located at two sides of the main body corresponding to the holes, a latching portion protruding from the main body;
   wherein the latching portion includes a resisting plate spaced from the main body and a latching groove defined between the main body and the resisting plate; the catch latches in the latching groove and resists the resisting plates; each protrusion latching in one of the holes.

2. The shielding assembly claimed in claim 1, wherein the cover includes a plurality of bent portions, each protrusion protruding from one of the bent portions.

3. The shielding assembly claimed in claim 2, wherein the frame includes two opposite sidewalls, the holes defined in the sidewalls.

4. The shielding assembly claimed in claim 3, wherein the frame further includes two opposite end walls respectively connecting with the sidewalls, the catch protruding from one of the end walls.

5. The shielding assembly claimed in claim 4, wherein the catch is substantially L-shaped.

6. The shielding assembly claimed in claim 1, wherein the latching portion is a hollow trapezoid.

7. The shielding assembly claimed in claim 6, wherein the latching portion further includes two connecting plates respectively protruding from opposite ends of the resisting plate for connecting the resisting plate to the main body.

8. The shielding assembly claimed in claim 7, wherein the latching portion is made by punching the main body, defining an opening in the main body and aligned with the resisting plate.

9. The shielding assembly claimed in claim 8, wherein the resisting plate is aligned with and shield the opening to improve the shielding effect of the shielding assembly.

10. A shielding assembly, comprising:
    a frame including a catch protruding near one end thereof; and
    a cover including a main body, the main body being punched to form an opening and a latching portion protruding from the main body and aligned with the opening; the latching portion latching with the catch, the latching portion shielding the opening to improve the shielding effect of the shielding assembly;

wherein the cover includes a plurality of bent portions, each bent portion protrudes a protrusion therefrom the frame defines a plurality of holes corresponding to the protrusions, each protrusion is latched in one of the holes.

11. The shielding assembly claimed in claim 10, wherein the frame includes two opposite sidewalls, the holes defined in the sidewalls.

12. The shielding assembly claimed in claim 11, wherein the frame further includes two opposite end walls respectively connecting with the sidewalls, the catch protruding one of the end walls.

13. The shielding assembly claimed in claim 12, wherein the catch is substantially L-shaped.

14. The shielding assembly claimed in claim 10, wherein the latching portion is a hollow trapezoid.

15. The shielding assembly claimed in claim 14, wherein the latching portion further includes two connecting plates respectively protruding from opposite ends of the resisting plate for connecting the resisting plate to the main body.

16. The shielding assembly claimed in claim 15, wherein the latching portion further includes a latching groove defined between the main body and the resisting plate, the catch is latched in the latching groove to further shield the opening.

* * * * *